United States Patent [19]

Yang et al.

[11] Patent Number: 6,008,121
[45] Date of Patent: Dec. 28, 1999

[54] ETCHING HIGH ASPECT CONTACT HOLES IN SOLID STATE DEVICES

[75] Inventors: Chi-Hua Yang, Yorktown; Virinder S. Grewal, Fishkill, both of N.Y.; Volker B. Laux, Munich, Germany

[73] Assignees: Siemens Aktiengesellschaft, Munich, Germany; International Business Machines Corporation, Armonk, N.Y.

[21] Appl. No.: 08/618,161

[22] Filed: Mar. 19, 1996

[51] Int. Cl.[6] .................................................. H01L 21/28
[52] U.S. Cl. .......................... 438/637; 438/723; 438/724; 438/743; 438/744; 438/952
[58] Field of Search ..................... 457/228, 195, 457/186; 156/653.11, 659.11, 661.11; 450/316, 317; 458/636, 637, 723, 724, 743, 744, 952

[56] References Cited

U.S. PATENT DOCUMENTS

| | | | |
|---|---|---|---|
| 4,473,435 | 9/1984 | Zafiroposio | 156/643 |
| 4,631,806 | 12/1986 | Poppert et al. | 437/203 |
| 5,028,550 | 7/1991 | Hirakawa | 437/31 |
| 5,182,787 | 1/1993 | Blonder et al. | 385/131 |
| 5,208,067 | 5/1993 | Jones et al. | 427/96 |
| 5,246,882 | 9/1993 | Hartmann | 437/195 |
| 5,254,417 | 10/1993 | Wada | 430/5 |
| 5,279,989 | 1/1994 | Kim | 427/195 |
| 5,279,990 | 1/1994 | Sun et al. | 437/195 |
| 5,302,538 | 4/1994 | Ishikawa et al. | 438/952 |
| 5,468,342 | 11/1995 | Nulty et al. | 438/723 |
| 5,536,098 | 7/1996 | Kuo et al. | 437/195 |
| 5,536,678 | 7/1996 | Peek | 437/195 |
| 5,550,085 | 8/1996 | Liu | 437/193 |
| 5,607,879 | 3/1997 | Wuu et al. | 437/193 |
| 5,635,355 | 6/1997 | Bae et al. | 430/317 |

Primary Examiner—John Niebling
Assistant Examiner—Ha Tran Nguyen
Attorney, Agent, or Firm—Donald B. Paschburg

[57] ABSTRACT

Contact holes through a dielectric are formed by forming a layer of polysilicon having a thickness between 0.02 um and 0.15 um inclusive on the dielectric, forming a layer of resist having a thickness between 0.4 um and 0.6 um inclusive on the layer of polysilicon, making a mask of the layer of resist, using it to form a mask in the layer of polysilicon and etching contact holes in the dielectric by exposing it to etching gasses through the apertures in the polysilicon mask. When the dielectric includes a layer of oxide adjacent the polysilicon mask and a layer of nitride between it and elements of the device, the resist mask is removed prior to etching the contact hole and a gas mixture of: $C_4F_8$; one of Ar, H, F; CO; $CF_4$ or $C_2F_6$ is used. Contact holes are made through a dielectric to conductors in a substrate by the same method, and desired cross sections are obtained by using a second resist mask and a selective etch for the polysilicon followed by a selective etch for the dielectric. These structures can be stacked and suitable interconnections made by the described method. Contact holes to gate electrodes can be etched using the basic process.

8 Claims, 4 Drawing Sheets

ETCHING HIGH ASPECT CONTACT HOLES IN SOLID STATE DEVICES

FIELD OF THE INVENTION

This invention is in the field of manufacturing solid state electrical devices.

BACKGROUND OF THE INVENTION

Elements of solid state devices are generally formed near the surface of a silicon substrate and covered with a layer of dielectric. Electrical connections to the elements are made by filling contact holes etched through the layer of dielectric with metal. Etching the contact holes by exposing the dielectric to appropriate gasses in a plasma through openings in a resist mask is sometimes uncontrollable because the carbon liberated from the resist mask forms a polymer in the contact holes that terminates the etching process before the contact holes reach a desired element.

In order to overcome this problem, a layer of polysilicon has been formed on the dielectric layer and made into a mask having apertures therein by exposing it to etching gasses through openings in a resist mask that is formed on top of it. The resist mask is removed and the contact holes are etched into the dielectric by exposing it to suitable ionized gasses through the apertures in the polysilicon mask. Because the resist mask is not present during the latter process, less carbon is produced and less polymer formed. Examples of this process are described in: U.S. Pat. No. 5,028,550 issued on Jul. 2, 1991 and entitled "Method of Manufacturing Semiconductor Device; U.S. Pat. No. 4,473,435 issued on Sep. 25, 1984 entitled "Plasma Etchant Mixture" and U.S. Pat. No. 5,279,989 issued on Jan. 18, 1994 and entitled "Method For Forming Miniature Contacts of Highly Integrated Semiconductor Devices."

As the dimensions of devices in a direction parallel to the substrate decrease, there is a need for the diameter of contact holes to be reduced. As noted in the U.S. Pat. No. 5,279,989, there is a limit to the minimum diameter of contact hole that can be attained using the resist masking process because the minimum diameter of the apertures formed in the polysilicon mask is too large. Although not stated in the patent, this diameter is 0.6 um when standard techniques are used. In order to effectively reduce the diameter of the apertures in the polysilicon mask in accordance with this patent, the resist mask used to form the apertures is removed and the new exposed polysilicon mask is coated with silicon dioxide. The silicon dioxide layer is then entirely removed except for the portion of it in contact with the inner edges of the apertures, which is referred to as a spacer, by a blanket etching process, but the polysilicon layer is not affected. Access holes are then etched in the dielectric by exposing it to etching gasses through the spacers that have a smaller diameter than the apertures in the polysilicon mask.

SUMMARY OF THE INVENTION

In accordance with this invention, contact holes having a diameter less than 0.25 um and an aspect ratio of greater than 8:1 are formed by a much simpler and therefore less expensive process than that of the U.S. Pat. No. 5,279,989 described immediately above. Whereas a resist mask customarily has a thickness of 0.8 um to 1.5 um and the polysilicon mask customarily has a thickness of 3 um, the thickness of the resist mask used in this invention is between 0.1 um and 0.6 um inclusive and preferably, the thickness of the polysilicon mask is between 0.02 um and 0.15 um inclusive. The apertures in the polysilicon mask are etched, for example, by exposing the polysilicon to ionized gasses such as HBr, HCl and $SF_6$ through the openings in the resist mask. The resist mask may then be removed, and the contact holes etched in the dielectric by exposing it through the apertures in the polysilicon mask to ionized gasses that etch the dielectric more rapidly than they etch polysilicon i.e. they selectively etch the dielectric with respect to the polysilicon.

In accordance with another aspect of this invention the gasses used for etching contact holes in a device having a dielectric comprised of a layer adjacent the substrate made of nitride and a layer on the nitride of silicon oxide include a mixture of $C_4F_8$, one of such gasses as Ar, He and Ne, CO, and one of $CHF_3$, $CF_4$ and $C_2F_6$. Using these gasses produces an etching rate in the silicon oxide that is thirty times greater than the etching rate in nitride, thereby ensuring that the nitride is not etched so as to destroy the device before the contact hole is fully etched. These gasses also etch the silicon dioxide at a rate that is fifty times greater than the rate at which they etch the polysilicon mask, thereby ensuring that the apertures in the polysilicon mask are not enlarged significantly before the etching of the contact hole is completed. This is important because enlargement of the apertures in the polysilicon mask would increase the diameter of the contact holes.

In accordance with another aspect of the invention, contact holes are etched into a device having a dielectric layer of nitride or oxide that is separated from the substrate by successive layers of sillicide and doped polysilicon in the following manner. As before, successive layers of thin polysilicon and thin photo resist are formed over the dielectric layer, and the photo resist is formed onto a mask having openings where the contact holes are to be located. Apertures are formed in the polysilicon by exposing it to HBr, HCl or $SF_6$ chemicals through the openings in the resist mask. Then the portions of the contact holes in the dielectric layer are etched by exposing it to $CHF_3/CF_4$ or $C_4F_8/CF_4$ ionized gas through the apertures in the polysilicon and the openings in the resist. At this point the photo resist mask is stripped, and the etching with one of the aforesaid ionized gasses is resumed to etch the contact holes through the sillicide and doped polysilicon layers to the substrate.

In accordance with still another aspect of the invention, interconnections between transistors may be fabricated by filling the contact apertures with metal, polishing the surface of the metal, removing the extra metal as well as the poly mask, and finally stopping at the dielectric layer. Another device can be formed in the added dielectric and connected to the previous device by contact holes formed as described.

DETAILED DESCRIPTION OF THE INVENTION

FIGS. 1A through 1F illustrate steps in a method for etching contact holes in a solid state device such as a DRAM that is comprised of a substrate 2, gate electrodes 4, 6 and 8 and two dielectric layers, 10, which is made of nitride, and 12, which is made of oxide. Like components are designated by the same number in these figures.

Figure 1A:
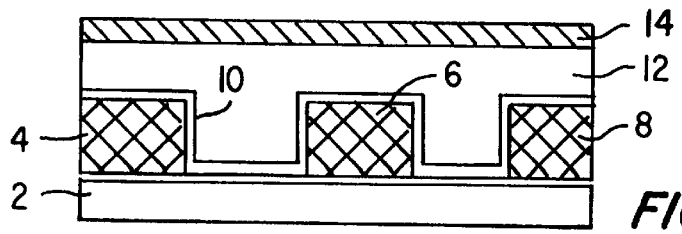
FIGS. 1A through 1F, illustrate steps in a method for etching contact holes in a device having nitride and oxide dielectric layers.

Fig. 1A shows the addition of a thin polysilicon layer 14 that is between a 0.02 um and 0.15 um inclusive.

Figure 1B:
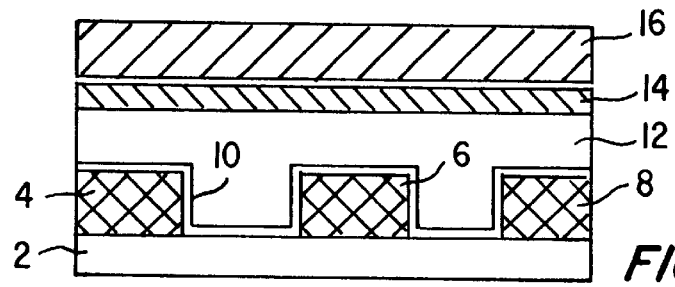
Figure 1C:
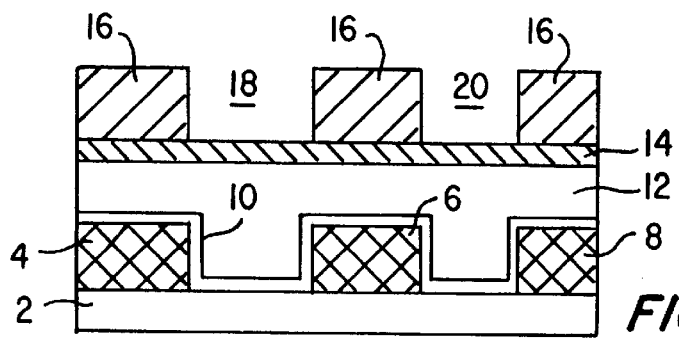

As shown in Fig. 1B, a layer 16 of photo resist has been formed on top of the layer 14 of polysilicon, and in FIG. 1C openings 18 and 20 have been formed in the photo resist layer 16 by known lithographic procedure to form a resist mask. Note that the polysilicon layer 14 is not affected.

Figure 1D:
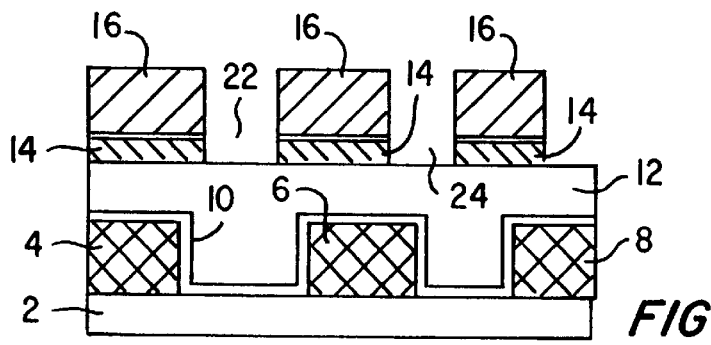

Fig. 1D illustrates the formation of apertures 22 and 24 in the polysilicon layer 14 by exposing it to HBR, HCL or F chemicals through the respective openings 18 and 20 in the resist mask formed from the layer 16 of resist. Note that the oxide dielectric layer 12 is not affected.

Figure 1E:
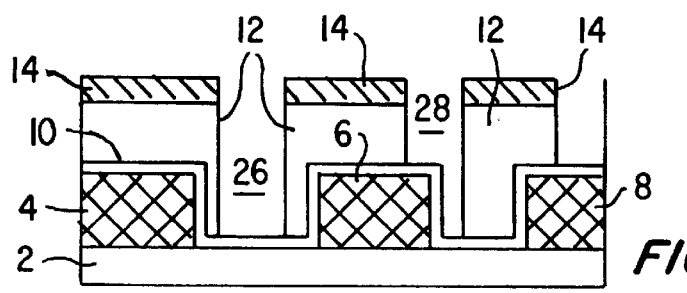
Figure 1F:
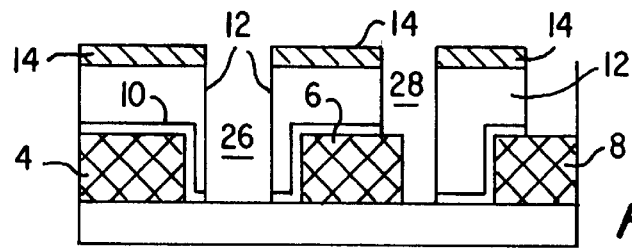

As shown in FIG. 1E, the resist mask formed from the resist layer 16 has been removed and the contact holes 26 and 28 have been etched through the oxide layer 12 to the nitride layer 10 to the substrate 2. The etching is performed by exposing the oxide layer 12 to one of the gas mixtures $C_4F_8$ and one of Ar, He, He and CO and one of $CHF_3$, $CF_4$ and $C_2F_6$. These mixtures etch the oxide layer 12 at a rate that is about thirty times as fast as they etch the nitride layer 10 so that the contact holes 26 and 28 are rapidly etched down to the oxide layer 10, as illustrated in FIG. 1E, without much affect in the nitride layer 10. Then, as shown in FIG. 1F, the contact holes 26 and 28 are etched farther so as to make contact with an appropriate element in a solid state device contained in the substrate 2 without damaging the device. At the same time, such mixtures of gasses etch the oxide layer 12 at a rate that is fifty times as fast as they etch the polysilicon layer 14, thereby permitting the contact holes 26 and 28 to be completely etched without significant enlarging of the apertures 22 and 24 in the polysilicon mask formed from the polysilicon layer 14 and thus enlarging the diameter of the contact holes 26 and 28.

Reference is now made to FIGS. 2A through 2I for a description of how contact holes can be formed in a multi-layer thin film interconnections in accordance with this invention. Like components are designated by the same number in these figures.

Figure 2A:
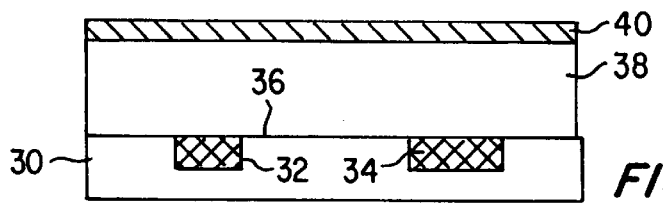
FIGS. 2A through 2I illustrate steps in a method for etching contact holes for multilayer thin film interconnections.
Figure 2B:
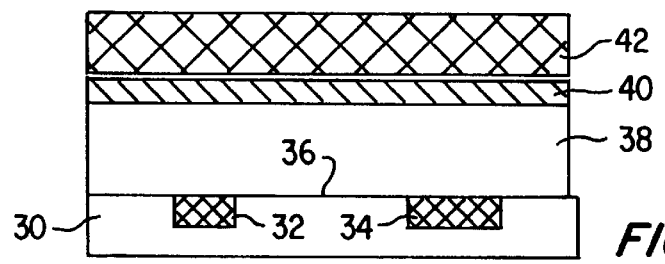

As illustrated, the thin film interconnections are comprised of a first silicon layer 30 having spaced parallel conductors 32 and 34 embedded in one surface 36 thereof and a layer 38 of dielectric that is contiguous with the surface 36. It is desired to etch contact apertures through the dielectric layer 38. In accordance with the invention, this is done in a manner similar to that previously described in connection with the FIGS. 1A through 1E. As shown in FIG. 2A, a thin layer 40 of polysilicon that has a thickness between 0.02 um and 0.15 um inclusive is formed on the dielectric layer 38 and, as shown in FIG. 2B, a thin layer 42 of photo resist, e.g. 0.4 um to 0.6 um inclusive in thickness, is formed on the top of the polysilicon layer 40.

Figure 2C:
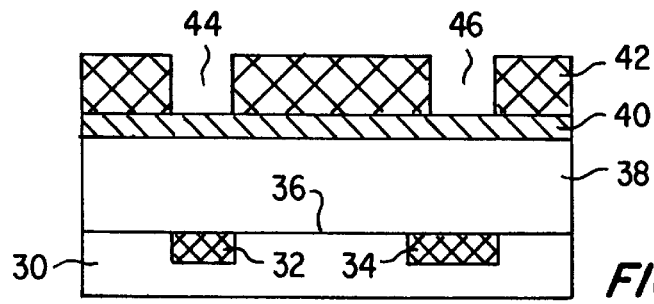
Figure 2D:
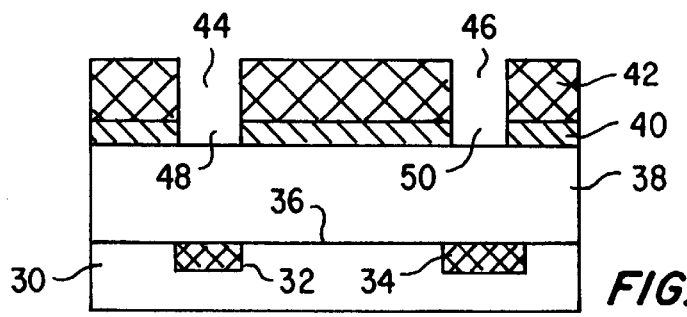

As shown in FIG. 2C, openings 44 and 46 have been formed by lithographic techniques in the resist layer 42 to form a resist mask. Then by use of HBr, HCl or $SF_6$ gas, apertures 48 and 50 are formed in the polysilicon layer 40 to make a polysilicon mask as shown in FIG. 2D.

Figure 2E:
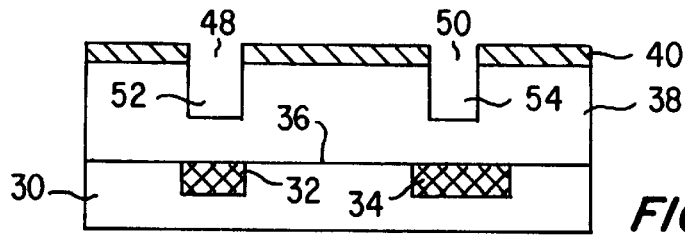

At this point, the photo resist mask formed in the layer 42 is removed, and parts 52 and 54 of contact holes, as shown in FIG. 2E are etched by introducing any gas that etches the dielectric layer 38 faster than it etches the polysilicon layer 40.

Figure 2F:
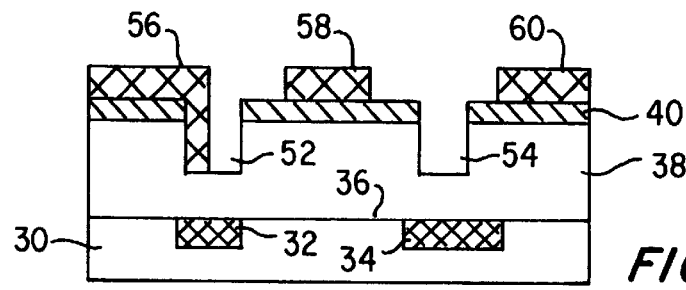
Figure 2G:
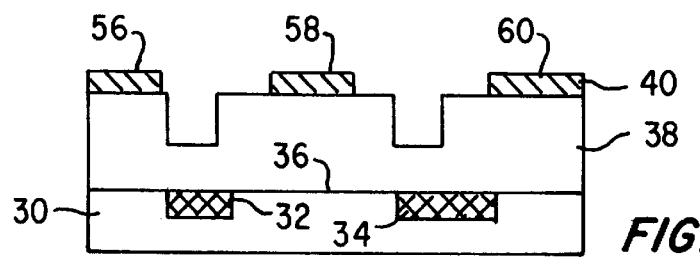

The partially completed contact holes 52, and 54 in FIG. 2E can be completed by adding a layer of photo resist in the locations indicated at 56, 58 and 60 of FIG. 2F and by etching with gasses that etch polysilicon faster than they etch the dielectric of the layer 38. By removing the resist, a structure as shown in FIG. 2G is produced. The dielectric of the layer 38 is hardly affected when the exposed polysilicon is removed because the latter is so thin.

Figure 2H:
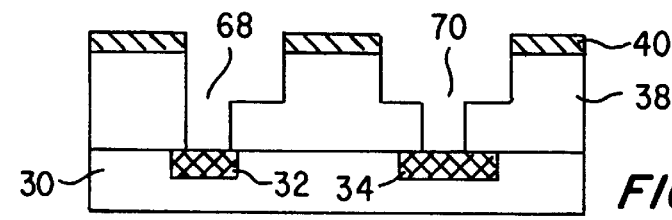

The final etching is done with gasses that etch oxide faster than they etch the polysilicon so as to produce contact holes 68 and 70 of FIG. 2H that have different cross-sections than would be attained by a single etch.

Figure 2I:
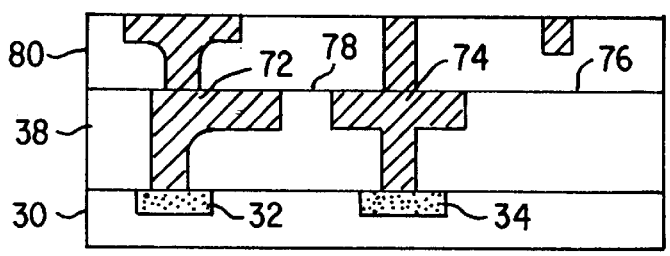

FIG. 2I shows contact holes 72, 74 and 76 of different shape that have been formed by the method first described. The layer 40 of polysilicon has been removed, and the contact holes filled with metal. The metal at the top of the holes 72, 74 and 76 has been chemically and mechanically polished in a plane 78, and a layer 80 of dielectric is formed on the surface 78. Other conductors that are like the conductors 32 and 34 can be formed in the layer 80 and connected as required through contact holes formed by the process just described beginning at FIG. 2A.

Figure 3A:
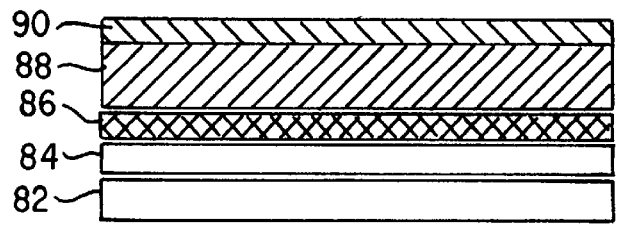
FIGS. 3A through 3D illustrate steps in a method for etching gate electrodes.
Figure 3B:
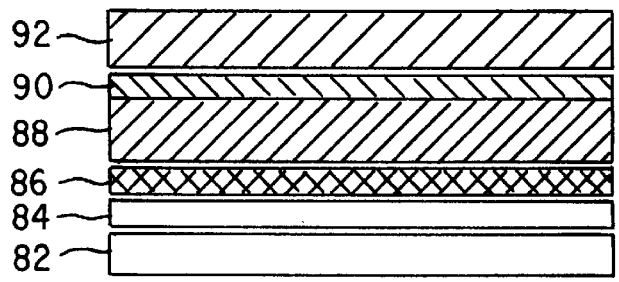
Figure 3C:
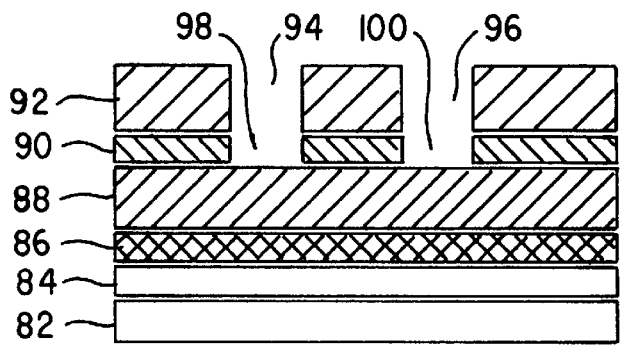
Figure 3D:
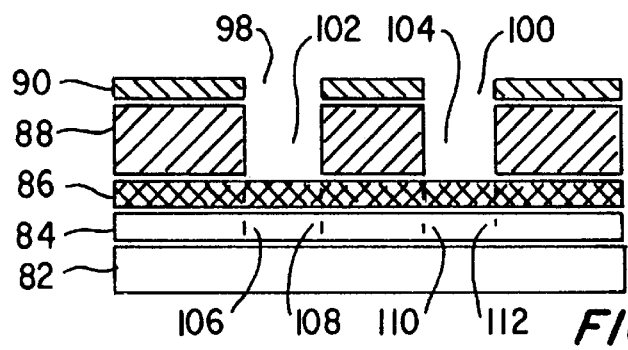

FIGS. 3A through 3E show steps in a method for forming a gate structure. Corresponding components in these figures are identified in the same way. The elements of the gate are formed in a silicon substrate 82 upon which are layers 84, 86, 88 and 90 of doped polysilicon, a conductive sillicide, nitride or oxide and a layer of polysilicon having a thickness of 0.02 um to 0.15 um inclusive. A layer 92 of resist is formed on the polysilicon layer 90 and is formed into a resist mask having openings such as shown at 94 and 96 of FIG. 3C for identifying the locations of gate conductors. Gasses such as HBR, HCL or $SF_6$ are introduced into the openings 94 and 96 so as to etch apertures 98 and 100 in the polysilicon layer 90. Excess materials outside gate conductors such as 102 and 104 shown in FIG. 3D are formed in the layer 88 of nitride or oxide using one of $CHF_3/CF_4$ and $C_4F_8/CF_4$ ionized gasses, and the photo resist mask structure in the layer 92 is removed. Then the etching is continued down to substrate 82 as indicated by the dashed lines 106, 108, 110 and 112 so as to sacrifice the polysilicon mask in the layer 90.

Although various embodiments of the invention have been shown and described herein, they are not meant to be limiting. Those of skill in the art may recognize certain modifications to these embodiments, which modifications are meant to be covered by the spirit and scope of the appended claims.

What is claimed is:

1. A method for producing contact holes through a dielectric layer to an element of a solid state device comprising the steps of:

forming a layer of polysilicon on the dielectric layer, the dielectric layer including an oxide layer formed on a nitride layer, the layer of polysilicon having a thickness between 0.02 um and 0.15 um inclusive;

forming a layer of resist material on the layer of polysilicon, the layer of resist material having a thickness between 0.4 um and 0.6 um inclusive;

forming openings in the layer of resist material at locations where each of the contact holes are to be formed in the dielectric layer;

etching apertures in the layer of polysilicon by exposing it to etching gas through the openings in the layer of resist material; and selectively etching contact holes in the dielectric layer by exposing it to etching gas through the apertures in the layer of polysilicon;

wherein the dielectric layer is comprised of silicon oxide in contact with the layer of polysilicon and nitride in contact with the silicon oxide and wherein the gas used to etch the dielectric is a mixture of: $C_4F_8$; one of Ar, H and Ne; CO; and one of $CF_4$ and $C_2F_6$; and wherein the layer of resist is removed before etching the contact holes.

2. A method as set forth in claim 1 wherein the etching gas to which the polysilicon layer is exposed in one of HBr, HCl and F.

3. A method for forming contact holes for a device for use as one layer of a multilayered integrated device comprising the steps of:

forming parallel conductors in the surface of a first substrate;

forming a layer of dielectric on that surface;

forming a layer of polysilicon material having a thickness between 0.02 um and 0.15 um inclusive on the layer of dielectric;

forming a first layer of resist having a thickness between 0.4 um and 0.6 um inclusive on said layer of polysilicon;

forming openings only in said layer of resist where contact holes are to be made through the layer of dielectric;

forming apertures in the layer of polysilicon by exposing it to an etching gas through said openings;

forming a first portion of a contact hole in the dielectric by exposing it to an etching gas through the apertures;

removing the first layer of resist in which the openings have been formed;

forming a second layer of resist at selected areas of the now exposed layer of polysilicon;

etching the exposed polysilicon with a gas that etches it faster than it etches the dielectric; and etching the dielectric with gas that etches it faster than it etches the exposed polysilicon so as to form a second portion of a contact hole that extends to a conductor.

4. A method as set forth in claim 3 further comprising the steps of:

filling the first and second portions of the contact hole with metal; and polishing the metal so as to form a surface that is contiguous with a given surface of the layer of dielectric.

5. A method as set forth in claim 4 further comprising the steps of:

forming a second layer of dielectric on the given surface having parallel conductors therein; and forming contact holes in the second layer of dielectric for providing connections to the metal.

6. A method for forming contact holes for a gate electrode in a substrate comprising the steps of:

forming a layer of doped polysilicon on the substrate;

forming a conductive layer of silicide on the layer of doped polysilicon;

forming a dielectric layer of one of oxide or nitride on the layer of silicide;

forming a layer of polysilicon having a thickness between 0.02 $\mu$m and 0.15 $\mu$m inclusive on the dielectric layer;

forming a layer of resist having a thickness between 0.4 $\mu$m and 0.6 $\mu$m inclusive on the layer of polysilicon;

forming openings in the layer of resist at locations contact holes are to have;

forming apertures in the layer of polysilicon by exposing it to etching gasses through the openings in the layer of resist;

forming portions of a contact hole that only extend part of the way through the layer of dielectric by exposing the dielectric layer to an etching gas through the apertures;

stripping the layer of resist; and continuing the etching so as to sacrifice the layer of polysilicon and extend the contact holes to the substrate.

7. A method as set forth in claim 6 wherein the etching gas used to form apertures in the thin layer of polysilicon is one of HBr, HCl and F.

8. A method as set forth in claim 6 wherein the etching gas used to form the contact holes is one of $CHF_3/CF_4$ and $C_4F_8/CF_4$.

* * * * *